(12) United States Patent
Liu et al.

(10) Patent No.: US 7,710,727 B2
(45) Date of Patent: May 4, 2010

(54) HEAT SINK ASSEMBLY

(75) Inventors: Jian Liu, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 127 days.

(21) Appl. No.: 12/146,396

(22) Filed: Jun. 25, 2008

(65) Prior Publication Data

US 2009/0268408 A1    Oct. 29, 2009

(30) Foreign Application Priority Data

Apr. 28, 2008    (CN)    .......................... 2008 1 0066698

(51) Int. Cl.
*H05K 7/20*    (2006.01)
*F28F 7/00*    (2006.01)
*H01L 23/34*    (2006.01)

(52) U.S. Cl. ...................... 361/710; 361/711; 165/185; 257/714

(58) Field of Classification Search ................. 361/710, 361/679, 689–700, 706, 709, 715, 716, 718, 361/719; 174/15.2, 16.3; 257/714, 715, 257/718, 719, 721–722; 165/80.2–80.5, 165/104.33, 185

See application file for complete search history.

(56) References Cited

U.S. PATENT DOCUMENTS

2007/0247819 A1 * 10/2007 Chen et al. .................. 361/729
2007/0263360 A1 * 11/2007 Lai et al. ..................... 361/719

* cited by examiner

*Primary Examiner*—Mark A Robinson
*Assistant Examiner*—Jerry Wu
(74) *Attorney, Agent, or Firm*—Frank R. Niranjan

(57) ABSTRACT

A heat sink assembly for an add-on card includes a heat sink and a clip received in the heat sink. The heat sink includes a supporting plate and a first and a second heat absorbing plates extending downwardly from the supporting plate. The first and second heat absorbing plates sandwich first and second heat conductive plates and the add-on card therebetween. The supporting plate is located over and spaced from the add-on card. The clip includes a resisting member, first and second engaging members and first and second pressing members. The resisting member is received in the heat sink and abuts upwardly against the supporting plate of the heat sink. The first and second engaging members engage with the first and second heat absorbing plates, respectively. The pressing members abut downwardly against a clasp clasping the conductive plates and the add-on card together.

18 Claims, 5 Drawing Sheets

HEAT SINK ASSEMBLY

BACKGROUND OF THE INVENTION

1. Field of the Invention

The present invention relates to a heat sink assembly, and more particularly to a heat sink assembly having a wire clip and a heat sink, wherein the wire clip is received in and abuts against the heat sink to enhance a stability of the heat sink.

2. Description of Related Art

Advances in microelectronics technology have resulted in add-on cards which process signals and data at unprecedented high speeds. During operation of many contemporary add-on cards such as memory module large amounts of heat are produced. The heat must be efficiently removed, to prevent the system from becoming unstable or being damaged.

A conventional heat sink is used to dissipate heat generated by the add-on cards. The add-on card comprises a bottom end adapted for engaging with a corresponding socket of a computer, and a top end opposite to the bottom end. The heat sink is made of aluminum and comprises a first heat absorbing plate, a second heat absorbing plate and a connecting portion connecting with the first and second heat absorbing plates. The add-on card is sandwiched between and thermally connects with the first and second heat absorbing plates. The top end of the add-on card abuts against a bottom surface of the connecting portion of the heat sink. When the add-on card assembled with the heat sink engages with the socket, the connecting plate of the heat sink is deformed by an upward press of the top end of the add-on card. Thus, the stability of the heat sink is unfavorably affected.

An improved heat sink assembly, which overcomes the above problems, is desired.

SUMMARY OF THE INVENTION

A heat sink assembly for dissipating heat generated by electronic components mounted on an add-on card includes a heat sink and a clip received in the heat sink. The heat sink includes a supporting plate, a first heat absorbing plate and a second heat absorbing plate extending downwardly from opposite edges of the supporting plate. The first and second heat absorbing plates sandwich the add-on card therebetween. The supporting plate spaces from the add-on card. The clip includes a resisting member and a first and a second engaging members. The resisting member is received in the heat sink and abuts upwardly against the supporting plate of the heat sink. The first engaging member extends from an end of the resisting member and engages with the first heat absorbing plate. The second engaging member extends from another end of the resisting member and intimately contacts the second heat absorbing plate of the heat sink. The clip further has a pair of pressing members located blow the resisting member a distance and between the resisting member and the first and second engaging members. The pressing members abut downwardly against a clasp which claps first and second heat conductive plates onto two opposite sides of the add-on card.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
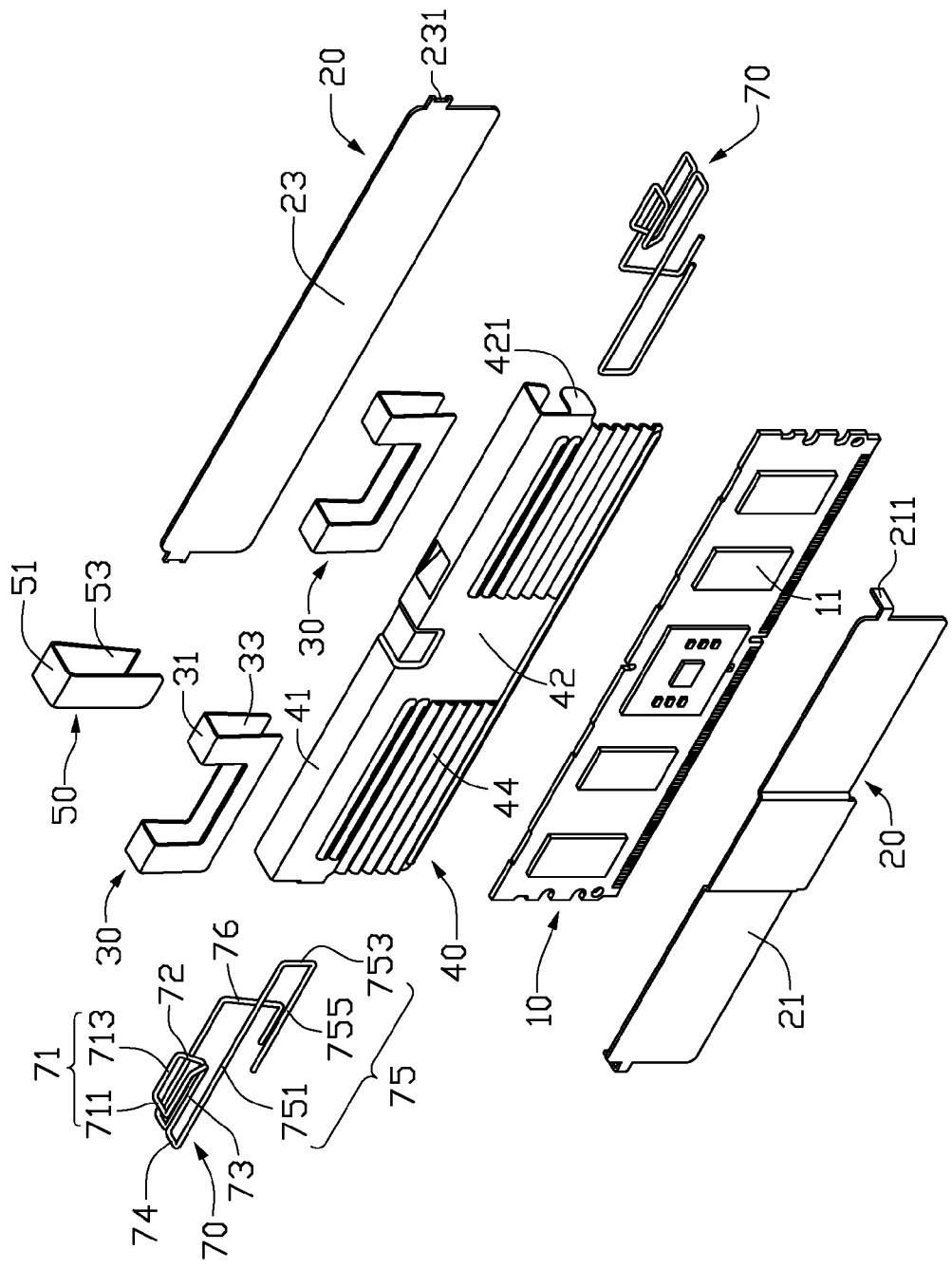
FIG. 1 is an exploded view of a heat sink assembly in accordance with a preferred embodiment of the present invention, and an add-on card.
Figure 2:
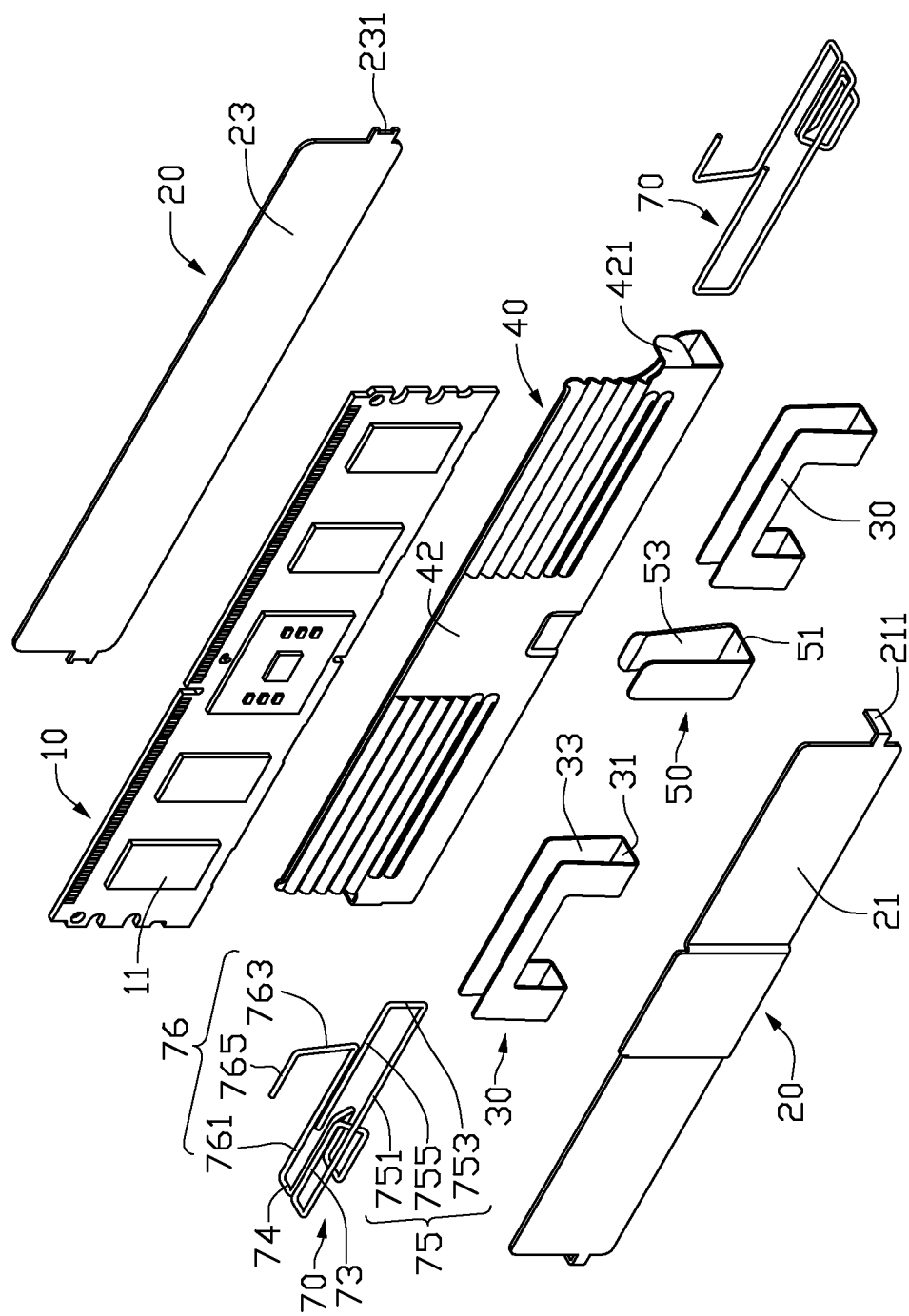
FIG. 2 is an inverted view of FIG. 1.

Referring to FIGS. 1-2, they illustrate a heat sink assembly (not labeled) for dissipating heat generated by electronic components 11 mounted on an add-on card 10. The heat sink assembly comprises a first heat sink 20 engaging with the add-on card 10, a pair of first clasps 30 clasping opposite ends of the first heat sink 20, a second heat sink 40 spanning across and contacting the first heat sink 20, a second clasp 50 clasping a centre portion of the second heat sink 40, and two clips 70. The clips 70 are received in and abut against the second heat sink 40.

The add-on card 10 is a rectangular plate. The add-on card 10 comprises a bottom end and a top end opposite to the bottom end. The bottom end has a plurality of electrical contacts (golden fingers) for electrically connecting with a socket (not shown).

The first heat sink 20 is made of metal such as aluminum or copper. The first heat sink 20 comprises a first heat conductive plate 21, and a second heat conductive plate 23. The first and second heat conductive plates 21, 23 sandwich the add-on card 10 therebetween and thermally contact with the electronic components 11 of the add-on card 10. The first heat conductive plate 21 forms a pair of L-shaped catches 211 at top portions of front and rear edges thereof, respectively. The second conductive plate 23 defines a pair of receiving portions 231 corresponding to the catches 211 of the first heat conductive plate 21. When the first heat sink 20 is assembled, the catches 211 of the first heat conductive plate 21 are engaged in the receiving portions 231 of the second heat conductive plate 23.

Each of the first clasps 30 is formed by bending a metal sheet and comprises a pair of spaced connecting plates 31, a pair of U-shaped pressing plates 33 extending downwardly from two lateral edges of the connecting plates 31, respectively. The first clasps 30 span across the first heat sink 20 and clasp front and rear ends of the first heat sink 20. The connecting plates 31 of the first clasps 30 abut against outer surfaces of the first and second heat conductive plates 21, 23 of the first heat sink 20.

The second clasp 50 is formed by bending a metal sheet and has an inverted U-shaped configuration. The second clasp 50 comprises a rectangular connecting plate 51 and a pair of pressing plates 53 extending downwardly from two opposite lateral edges thereof.

Figure 3:
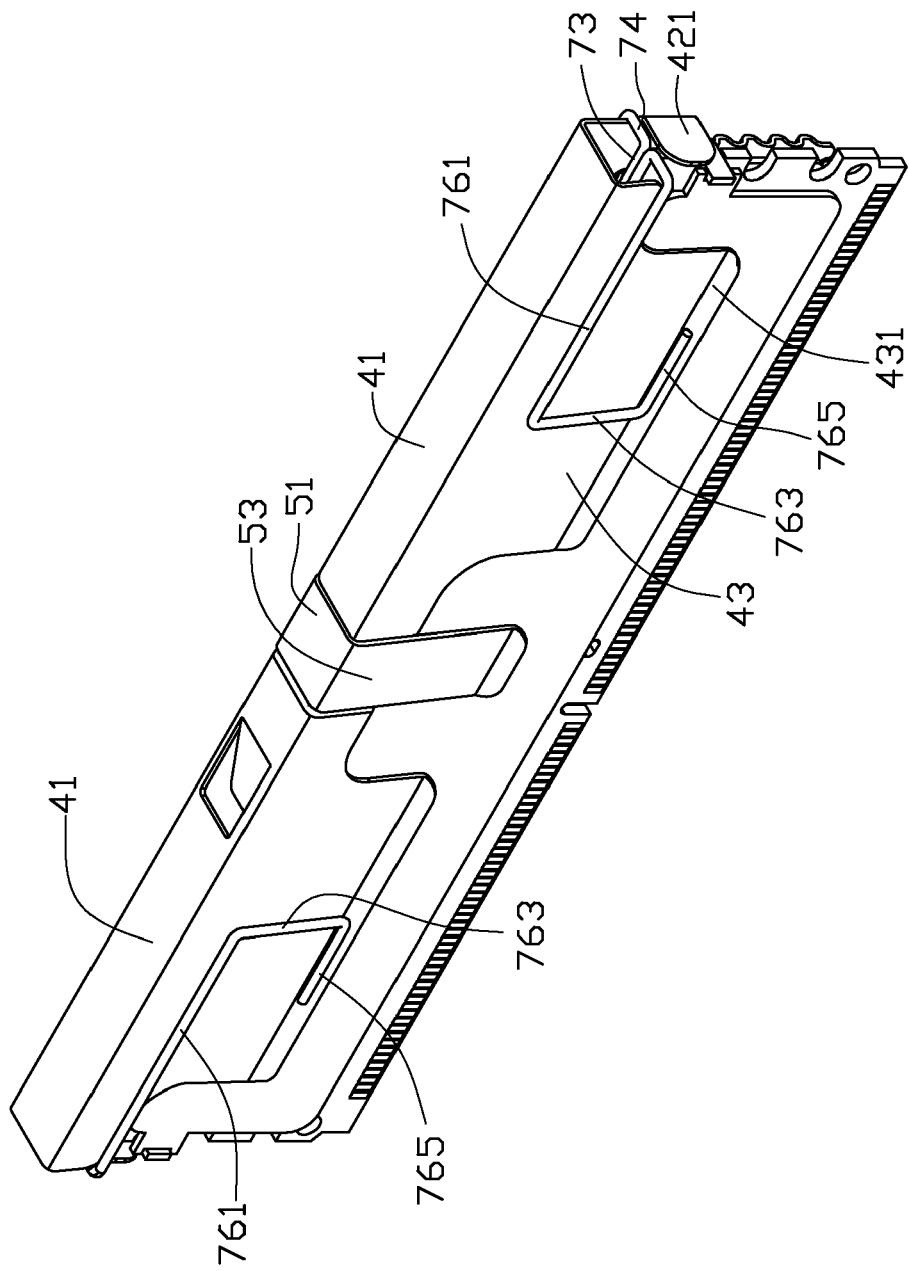
FIG. 3 is an assembled view of the heat sink assembly of FIG. 1 and the add-on card.
Figure 4:
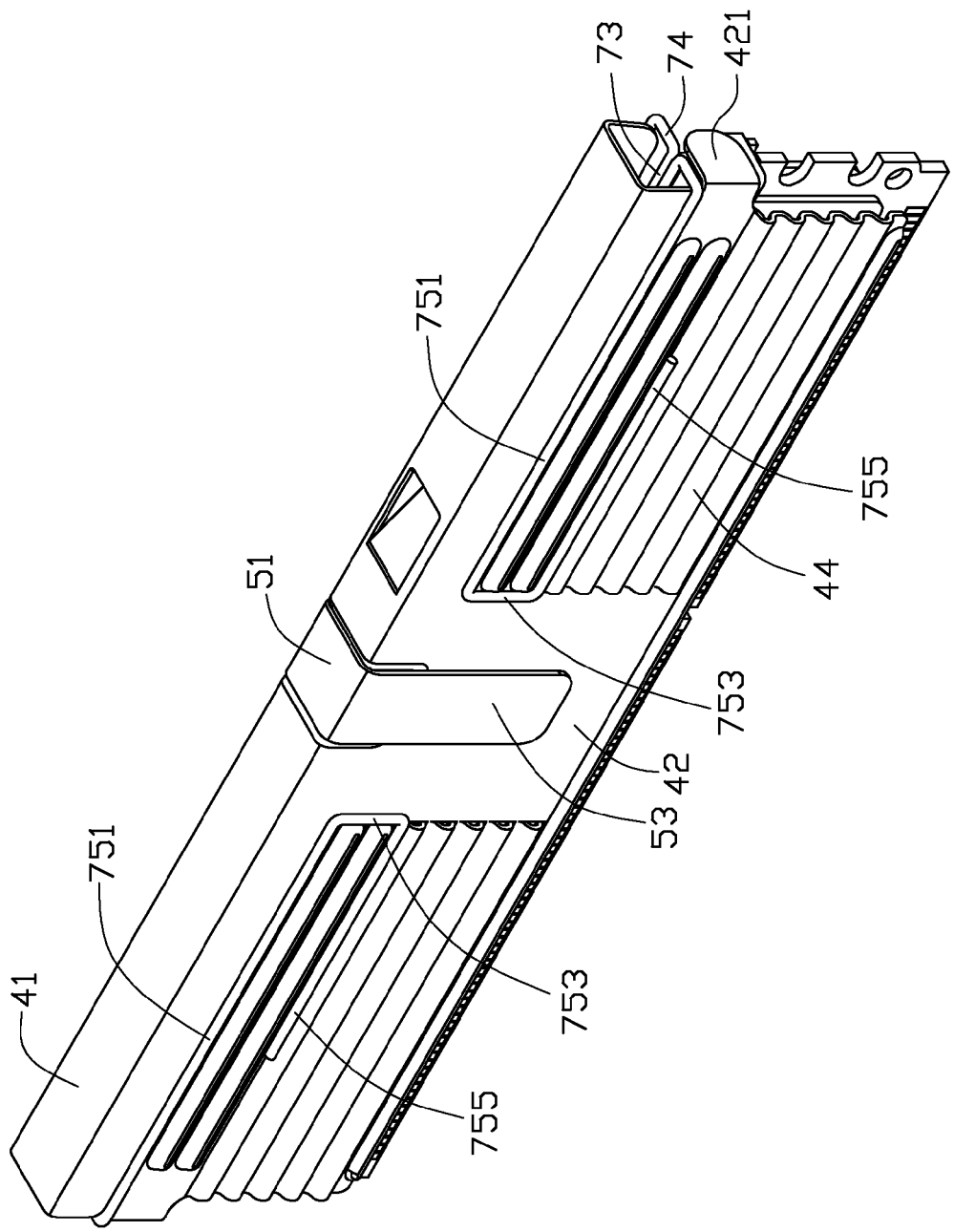
FIG. 4 is a view similar to FIG. 3, but viewed from another aspect.

Referring to FIGS. 3-4 also, the second heat sink 40 is formed by stamping a metal sheet and has an inverted U-shaped configuration. The second heat sink 40 comprises an elongated supporting plate 41, first and second heat absorbing plates 42, 43 extending downwardly from two opposite lateral edges of the supporting plate 41. The first and second heat absorbing plates 42, 43 thermally contact with the first and second heat conductive plates 21, 23 of the first heat sink 20 respectively. The supporting plate 41 is located at a top of and spaced from the connecting plates 31 of the first clasps 30 a distance. Thus, a receiving space is defined between the supporting plate 41 of the second heat sink 40 and the top of the first heat sink 20.

The first heat absorbing plate 42 is rectangular and forms a pair of baffling portions 421 at top portions of front and rear edges thereof to sandwich the first heat sink 20 and the add-on card 10 therebetween. The first heat absorbing plate 42 has a plurality of fins 44 punched at front and rear portions thereof to dissipate heat absorbed by the second heat sink 40. The fins 44 are spaced from each other and have a wavy configuration. The second heat absorbing plate 43 is rectangular and forms a flange 431 bent outwardly at a bottom edge thereof to engage with the clips 70. A centre portion of the second heat sink 40 at the top thereof defines a recess (not labeled). The second clasp 50 is received in the recess and spans across the second heat sink 40 to make the first and second heat absorbing plates 42, 43 of the second heat sink 40 intimately contact with the first and second heat conductive plates 21, 23 of the first heat sink 20.

The clips 70 each are made from a single spring wire. A part of the clips 70 is received in the receiving space of the second heat sink 40 and abuts against the supporting plates 41 of the second heat sink 40. The clips 70 are located at front and rear sides of the second heat sink 40 and are symmetrically distributed (mirror imaged) relative to the centre portion of the second heat sink 40.

Each clip 70 (taking the left one in FIG. 1 as example) comprises a U-shaped resisting member 71, a pair of first connecting members 72 extending downwardly from the resisting member 71, a pair of pressing members 73 extending from the first connecting members 72, a pair of second connecting members 74 extending from the pressing members 73, a first engaging member 75 extending from one of the second connecting members 74, and a second engaging member 76 extending from the other second connecting member 74. The resisting member 71 comprises a straight transiting portion 711, and a pair of parallel resisting portions 713 extending perpendicularly from two opposite ends of the transiting portion 711 along a rear-to-front direction. The first connecting members 72 extend downwardly and slantwise from ends of the resisting portions 713 respectively and form a V-shaped configuration in a manner such that lower ends of the first connecting members 72 are spaced more closely together than upper ends of the first connecting members 72. The pressing members 73 extend from ends of the first connecting members 72 respectively along a front-to-rear direction and are parallel to and abut against each other. The pressing members 73 are located at a centre of a bottom portion of the resisting member 71. The pressing members 73 are longer than the resisting portions 713 of the resisting member 71. The second connecting members 74 perpendicularly extend from ends of the pressing members 73 respectively towards opposite directions and are parallel to the transiting portion 711 of the resisting member 71. The first and second engaging members 75, 76 extend from the second connecting members 74 respectively.

The first engaging member 75 has a U-shaped configuration. The first engaging member 75 comprises a first engaging portion 751, a second engaging portion 755 parallel to the first engaging portion 751 and a linking portion 753 perpendicularly connecting with the first and second engaging portions 751, 755. The first engaging portion 751 extends from one of the second connecting members 74 along the rear-to-front direction. The second engaging portion 755 extends from a lower end of the linking portion 753 along the front-to-rear direction. The second engaging portion 755 is shorter than the first engaging portion 751 and located below the first engaging portion 751.

The second engaging member 76 is similar to the first engaging member 75 and has a U-shaped configuration. The second engaging member 76 comprises a first engaging portion 761, a second engaging portion 765 parallel to the first engaging portion 761 and a linking portion 763 connecting with the first and second engaging portions 761, 765. The first engaging portion 761 extends from the other second connecting member 74 along the rear-to-front direction. The second engaging portion 765 extends from a lower end of the linking portion 763 along the front-to-rear direction. The second engaging portion 765 is shorter than the first engaging portion 761 and located below the first engaging portion 761. The first engaging portion 761 is shorter than the first engaging portion 751 of the first engaging member 75.

Figure 5:
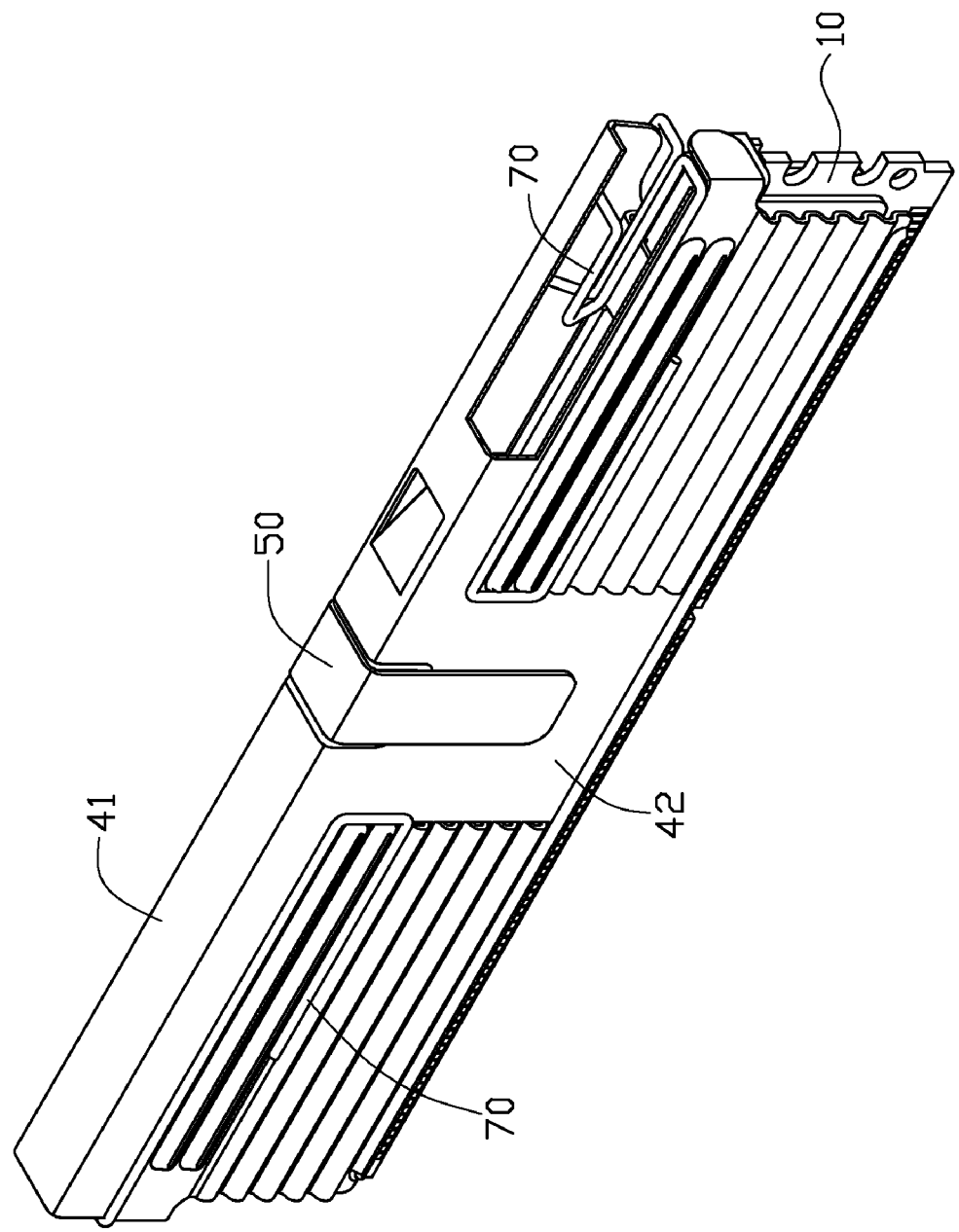
FIG. 5 is a view similar to FIG. 4, with a part of a second heat sink of the heat sink assembly being removed to clearly show an inner structure thereof.

Referring to FIG. 5 also, when assembled, the first and second engaging members 75, 76 of the clips 70 are drawn outwardly towards opposite directions in a manner such that the first and second engaging members 75, 76 of the clips 70 move apart far away each other and are simultaneously attached to outer walls of the first and second heat absorbing plates 42, 43 of the second heat sink 40. The resisting portions 71, and the pressing portions 73 of the clips 70 are pressed into the receiving space of the second heat sink 40 from opposite directions. In this state, the second connecting members 74 of the clips 70 abut against the front and rear edges of the first heat absorbing plate 42 of the second heat sink 40, respectively. The resisting members 71 abut against a bottom surface of the supporting plate 41 of the second heat sink 40. The pressing members 73 press the connecting plates 31 of the first clasps 30. The first engaging members 75 and the second engaging members 76 engage with the first and second heat absorbing plate 42, 43 respectively. In this state, each of the first engaging members 75 engages with a pair of fins 44 located near a top of the first heat absorbing plate 42 in a manner such that the first and second engaging portions 751, 755 sandwich two fins 44 therebetween, and the linking portion 753 engages inner ends of the two fins 44. The second engaging portions 765 of the second engaging members 76 press against the flange 431 of the second heat absorbing plate 43 of the second heat sink 40.

When the bottom end of the add-on card 10 is inserted into the socket (not shown) in a computer via pressing the supporting plate 41 of the second heat sink 40, the top end of the add-on card 10 abuts against bottom surfaces of the connecting plates 31 of the first clasps 30. Because the resisting members 71 of the clips 70 abut against the bottom surface of the supporting plate 41, and the pressing members 73 of the clips 70 press the top surfaces of the connecting plates 31, deformation of the second sink 40 is alleviated and stability of the second heat sink 40 is enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly, adapted for dissipating heat generated by electronic components mounted on an add-on card, the heat sink assembly comprising:

a heat sink comprising a supporting plate, a first heat absorbing plate and a second heat absorbing plate extending downwardly from two opposite lateral edges of the supporting plate, the first and second heat absorbing plates being adapted for sandwiching the add-on card therebetween and the supporting plate located above and spaced from the add-on card a distance; and a wire clip comprising a resisting member received in the heat sink and resisting a bottom surface of the supporting plate of the heat sink, a first engaging member extending from an end of the resisting member and engaging with the first heat absorbing plate, a second engaging member spaced from the first engaging member and extending from another end of the resisting member and intimately contacting the second heat absorbing plate of the heat sink.

2. The heat sink assembly as claimed in claim 1, wherein the first heat absorbing plate forms a plurality of fins, the first engaging member of the clip engaging with the fins.

3. The heat sink assembly as claimed in claim 2, wherein the first engaging member has a U-shaped configuration and comprises a first engaging portion extending from the resisting member, a second engaging portion located below the first engaging portion and a linking portion connecting with the first and second engaging portions, the first and second engaging portions sandwiching some of the fins therebetween, the linking portion abutting against inner ends of the some of the fins.

4. The heat sink assembly as claimed in claim 2, wherein the second engaging member has a U-shaped configuration and comprises a first engaging portion extending from the resisting member, a second engaging portion located below the first engaging portion, and a linking portion connecting with the first and second engaging portions, the first engaging portion and the linking portion intimately contacting with the second heat absorbing plate of the heat sink, the second engaging portion pressing a flange formed on a bottom edge of the second heat absorbing plate.

5. The heat sink assembly as claimed in claim 1 further comprising a clasp adapted for engaging with a top end of the add-on card, the clip comprising a pair of pressing members extending from the resisting member and pressing the clasp.

6. The heat sink assembly as claimed in claim 5, wherein the resisting member has a U-shaped configuration and comprises a transiting portion and a pair of resisting portions extending from two opposite ends of the transiting portion.

7. The heat sink assembly as claimed in claim 6, wherein the clip further comprises a pair of first connecting members extending downwardly and slantwise from ends of the resisting portions respectively and connecting ends of the pressing portions with the pressing members, respectively.

8. The heat sink assembly as claimed in claim 7, wherein the clip further comprises a pair of second connecting members, one of the second connecting members connecting a corresponding pressing member and the first engaging member, the other second connecting member connecting a corresponding pressing member and the second engaging member, the second connecting members being located an outside of the heat sink and abutting against an end of the heat sink.

9. The heat sink assembly as claimed in claim 5 further comprising an additional heat sink which comprises a first heat conductive plate and a second heat conductive plate, the first and second heat conductive plates adapted for sandwiching the add-on card therebetween, the heat sink spanning across the additional heat sink and the first and second heat absorbing plates respectively contacting with the first and second heat conductive plates, the clasp clasping the first and second heat conductive plates.

10. The heat sink assembly as claimed in claim 1 further comprising an additional wire clip which comprises a second resisting member received in the heat sink and resisting a bottom surface of the supporting plate of the heat sink, a first engaging member extending from an end of the second resisting member and engaging with the first heat absorbing plate, a second engaging member spaced from the first engaging member and extending from another end of the second resisting member and intimately contacting the second heat absorbing plate of the heat sink.

11. The heat sink assembly as claimed in claim 10, wherein the clip and the additional clip are symmetrically distributed relative to a centre portion of the heat sink.

12. An electronic assembly comprising:
an add-on card;
a plurality of electronic components mounted on opposite sides of the add-on card;
a heat sink comprising a supporting plate, a first heat absorbing plate and a second heat absorbing plate extending downwardly from two lateral edges of the supporting plate, the add-on card being sandwiched between the first and second heat absorbing plates, a top of the add-on card being below and spaced from the supporting plate; and
a wire clip comprising a resisting member received in the heat sink and abutting against a bottom surface of the supporting plate of the heat sink, a first engaging member extending from an end of the resisting member and engaging with the first heat absorbing plate, a second engaging member spaced from the first engaging member and extending from another end of the resisting member and intimately contacting the second heat absorbing plate of the heat sink.

13. The electronic assembly as claimed in claim 12, wherein the first heat absorbing plate forms a plurality of fins to engage with the first engaging member of the clip, and the second heat absorbing plate forms a flange at an edge thereof to support the second engaging member of the clip.

14. The electronic assembly as claimed in claim 13, wherein the first engaging member comprises a first engaging portion extending from the resisting member, a second engaging portion located below the first engaging portion and a linking portion connecting with the first and second engaging portions, the first and second engaging portions sandwiching some of the fins therebetween, the linking portion abutting against inner ends of the some of the fins.

15. The electronic assembly as claimed in claim 13, wherein the second engaging member comprises a first engaging portion extending from the resisting member, a second engaging portion located below the first engaging portion, and a linking portion connecting with the first and second engaging portions, the first engaging portion and the linking portion intimately contacting with the second heat absorbing plate of the heat sink, the second engaging portion pressing the flange of the second heat absorbing plate.

16. The electronic assembly as claimed in claim 12 further comprising a clasp adapted for engaging with a top end of the add-on card, the clip comprising a pair of pressing members extending from the resisting member and pressing the clasp.

17. The electronic assembly as claimed in claim 16, wherein the clip further comprises a pair of first connecting members extending downwardly and slantwise from the resisting member, the pair of pressing members extending outwardly from ends of the first connecting members respectively and pressing the clasp, and a pair of connecting members connecting the pressing members and the first and second engaging members.

18. The electronic assembly as claimed in claim 17, wherein the first engaging portions and the second engaging portions of the first and second engaging members and the pressing members are parallel to each other.

* * * * *